United States Patent [19]
Date et al.

[11] Patent Number: 5,973,558
[45] Date of Patent: Oct. 26, 1999

[54] DIFFERENTIAL AMPLIFIER CIRCUIT

[75] Inventors: Yoshito Date, Otsu; Tetsuro Ohmori, Hirakata, both of Japan

[73] Assignee: Matsushita Electric Industrial Co., Ltd., Japan

[21] Appl. No.: 09/102,581

[22] Filed: Jun. 23, 1998

[30] Foreign Application Priority Data

Jul. 15, 1997 [JP] Japan .................................. 9-188827

[51] Int. Cl.⁶ ...................................................... H03F 1/14
[52] U.S. Cl. ............................................. 330/51; 330/261
[58] Field of Search .................................... 330/261, 253, 330/252, 51, 292, 280

[56] References Cited

U.S. PATENT DOCUMENTS

| | | | |
|---|---|---|---|
| 4,104,596 | 8/1978 | Smither | 330/9 |
| 5,841,317 | 11/1998 | Ohmori et al. | 327/563 |
| 5,847,599 | 12/1998 | Zhang | 330/9 |

*Primary Examiner*—Robert Pascal
*Assistant Examiner*—Henry Choe
*Attorney, Agent, or Firm*—Parkhurst & Wendel, L.L.P.

[57] ABSTRACT

It is an object of this invention to provide a differential amplifying apparatus capable of increasing the speed at which a standby state is changed to a normal state and reducing distorted waves. The present differential amplifying apparatus comprises: a differential circuit (1); an output circuit (2); bias voltage generating circuits (608, 610); a switch (609) for controlling the bias voltage generating circuits; a transistor (201) and a capacitor (203) connected in series between the output of the bias voltage generating circuit and a ground; a transistor (202) connected in parallel with the capacitor (203). A signal having the same polarity as a signal STBY controlling the switch (609) is supplied to the gate of the transistor (201), while a signal having a polarity opposite to that of the signal STBY is supplied to the gate of the transistor (202). Electric charge in a parasitic capacitance 611 of a bias signal VBIAS is also discharged through the capacitor (203) added separately from a resistor (610), thereby reducing the discharge time.

6 Claims, 12 Drawing Sheets

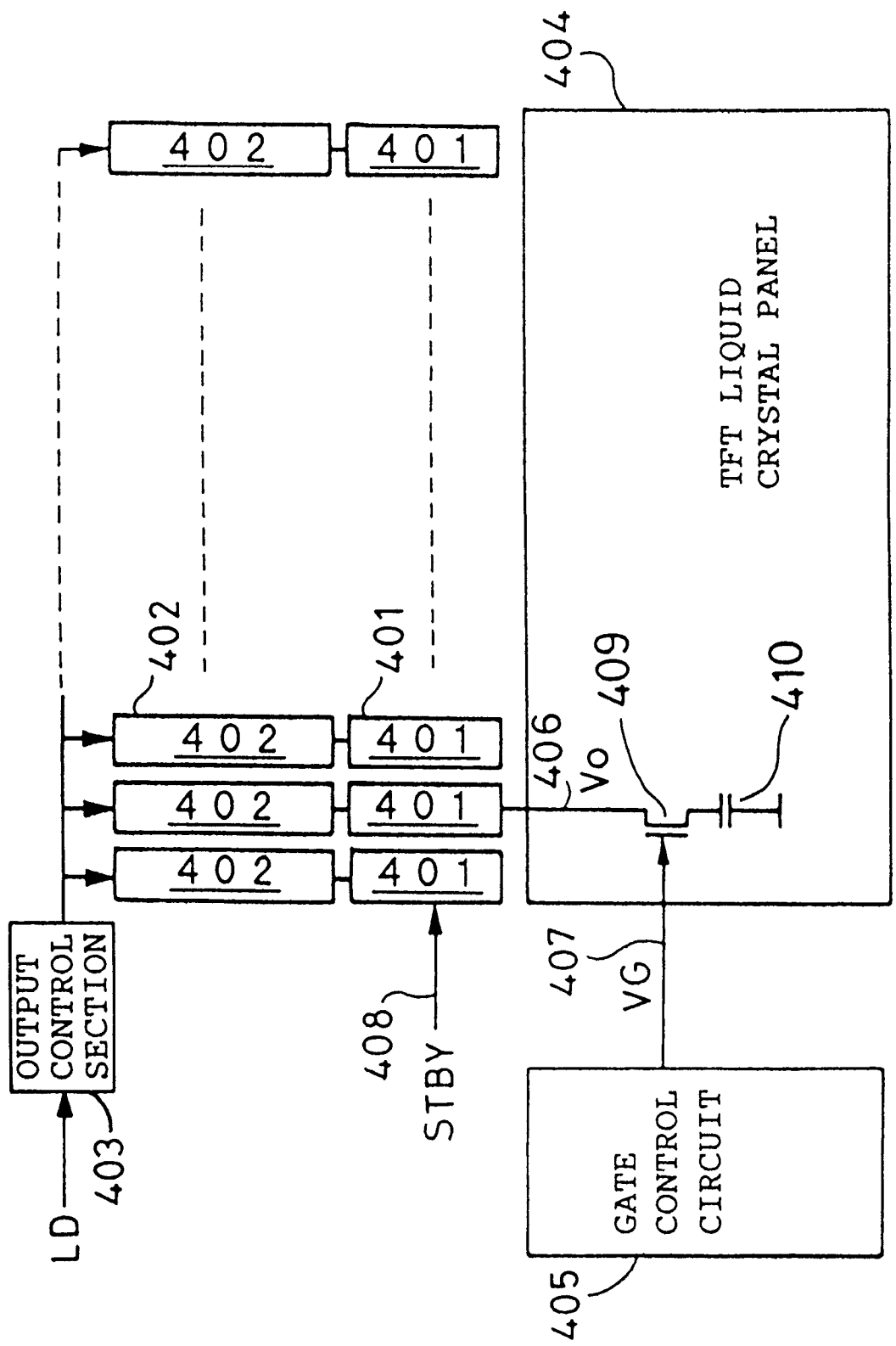

DIFFERENTIAL AMPLIFIER CIRCUIT

FIELD OF THE INVENTION

The present invention relates to a differential amplifying apparatus that is, for example, integrated into a liquid crystal driver for driving a TFT matrix color liquid crystal panel and that is used for a capacitive digital/analog converter for converting a digital color image signal to an analog voltage. If this differential amplifying apparatus is configured as an integrated circuit, a large number of such apparatuses are installed on a single semiconductor substrate in parallel so as to correspond to an array of TFT matrix color liquid crystal panels.

BACKGROUND OF THE INVENTION

A conventional differential amplifying apparatus is configured as shown in FIG. 9 or 11.

In the following description, a "P channel MOS transistor" is represented as a "P-ch transistor". An "N channel MOS transistor" is represented as an "N-ch transistor".

First, the differential amplifying apparatus shown in FIG. 9 is explained.

This differential amplifying apparatus is composed of a differential circuit 1; an output circuit 2; a bias voltage generating circuit composed of a P-ch transistor and a resistor R; and a controlling P-ch transistor that connects a bias voltage VBIAS to a power supply voltage to turn off the current through the differential circuit 1 and output circuit 2.

The differential circuit 1 is composed of P-ch transistors 601, 602, and 603 and N-ch transistors 604 and 605.

The P-ch transistor 601 has its source connected to a power supply voltage VDD to provide the constant bias VBIAS to its gate in order to function as a constant current source.

The sources of the two P-ch transistors 602 and 603 are both connected to the drain of the P-ch transistor 601. The drain of the N-ch transistor 604 is connected to the drain of the P-ch transistor 602, and the drain of the N-ch transistor 605 is connected to the drain of the P-ch transistor 603.

The sources of the N-ch transistors 604 and 605 are connected together for grounding, and the gates of these transistors are connected together and to the drain of the P-ch transistor 603, that is, the drain of the N-ch transistor 605.

In the output circuit 2, the source of the constant-current source transistor 606 consisting of a P-ch transistor is connected to the power supply voltage VDD, and the constant bias VBIAS is applied to the gate of the constant-current source transistor 606. The drain of the controlling transistor 607 consisting of an N-ch transistor is connected to the drain of the constant-current source transistor 606, the source of the controlling transistor 607 is grounded, and the gate of the controlling transistor 607 is connected to the drain of the P-ch transistor 602 that is an output terminal of the differential circuit 1.

The P-ch transistor 608 constituting a bias voltage generating circuit has its source connected to the power supply voltage VDD and its gate connected to its drain. The drain terminal is grounded via a resistor 610.

In the connection between the P-ch transistor 608 and resistor 610, a constant voltage is determined by design parameters such as the width and length of the gate of the P-ch transistor 608 and the resistance value of the resistor 610. This voltage VBIAS is supplied as a gate voltage for the transistor for biasing the differential circuit 1 and output circuit 2.

If the differential amplifying apparatus in FIG. 9 is applied to a TFT liquid crystal driving apparatus, as many circuits as the pixels are required. Thus, several-hundred differential circuits must be arranged in the same semiconductor apparatus.

To reduce increasing current consumption, the P-ch transistor 608 and resistor 610 must be designed to provide a minimum amount of current required. Thus, in the differential circuit used for the liquid crystal driving apparatus, the bias voltage VBIAS is relatively close to the power supply voltage ($\approx$VDD−1 volt) and several-ten K$\Omega$ is selected as the resistance value R to provide a low current.

The P-ch transistor 609 has its source connected to the power supply voltage VDD, its gate connected to a standby control signal STBY, and its drain connected to the bias voltage VnIAS. Reference numeral 611 designates a parasitic capacitance generated in the wiring for the bias voltage signal VBIAS and represented by a capacitance value C1.

Next, the operation of the differential amplifying apparatus shown in FIG. 9 is described with reference to FIG. 10.

In a normal state, the standby control signal STBY is at an "H" level and the P-ch transistor 609 is turned off. Thus, the bias voltage VBIAS is generated and determined by the P-ch transistor 608 and resistor 610.

The differential circuit 1 has an inverting input terminal V− and a non-inverting input terminal V+. The inverting input terminal is connected to an output terminal Vo, and the differential circuit 1 and output circuit 2 constitute a null amplifier. Thus, if a Vin signal is input to the non-inverting input terminal V+, a voltage almost the same as Vin is generated at the output terminal Vo.

Next, the STBY signal is changed to an "L" level. Then, the P-ch transistor 609 is turned on to increase the bias voltage VBIAS up to the power supply voltage VDD.

The voltage VrIAS is set at about (VDD−1 voltage) due to a low-current-consumption design. Thus, the voltage can be increased up to the power supply voltage at a high speed depending on the designed size of the P-ch transistor 609.

At this point, the gate voltages of the P-ch transistor 601 in the differential circuit 1 and the P-ch transistor 606 in the output circuit 2 increase up to the power supply voltage VDD to prevent a current from flowing through the transistors 601 and 606. Thus, the differential circuit 1 and output circuit 2 consume no current and are in a standby state. The voltage at the output terminal Vo becomes indeterminate.

Next, the STBY signal is changed to an "H" level to switch the standby state to a normal operation state. This causes the P-ch transistor 609 to be turned off. VBIAS, which has increased up to the power supply voltage, has the parasitic capacitance 611 of the capacitance value C1 in which charges constituting the power supply potential are accumulated. The resistance value R of the resistor 610 serves to discharge the charges accumulated in the parasitic capacitance and to reduce VBIAS down to the normal operation potential ($\approx$VDD−1 voltage).

FIG. 11 shows another conventional differential amplifying apparatus.

In the differential amplifying apparatus in FIG. 11, the P-ch transistors of the differential and output circuits 1 and 2 shown in FIG. 9 are replaced by N-ch transistors.

The differential circuit 3 is composed of N-ch transistors 701, 702, and 703 and P-ch transistors 704 and 705.

The N-ch transistor 701 has its source connected to VSS to provide a constant bias VBIAN to its gate in order to function as a constant current source.

The sources of the two N-ch transistors 702 and 703 are both connected to the drain of the N-ch transistor 701. The drain of the P-ch transistor 704 is connected to the drain of the N-ch transistor 702, and the drain of the P-ch transistor 705 is connected to the drain of the N-ch transistor 703.

The sources of the P-ch transistors 704 and 705 are connected together and to the power supply voltage VDD, and the gates of these transistors are connected together and to the drain of the N-ch transistor 703, that is, the drain of the P-ch transistor 705.

The output circuit 4 is composed of the N-ch transistor 706 and the P-ch transistor 707. The N-ch transistor 706 has its source grounded to provide the constant bias VBIASN to its gate in order to function as a constant current source.

The drain of the P-ch transistor 707 is connected to the drain of the N-ch transistor 706, and the P-ch transistor 707 has its source connected to the power supply voltage VDD and its gate connected to the drain of the N-ch transistor 702 that is an output terminal of the differential circuit 3.

The P-ch transistor 608 constituting a bias voltage generating circuit has its source connected to the power supply voltage VDD and its gate connected to its drain. The drain terminal is grounded via the resistor 610. In the connection between the P-ch transistor 608 and resistor 610, a constant voltage is determined by design parameters such as the width and length of the gate of the P-ch transistor 608 and the resistance value R of the resistor 610.

This voltage VBIAS is supplied as a gate voltage for the transistor for biasing the differential circuit 3 and output circuit 4. The bias voltage VBIAS is connected to the gate of the P-ch transistor 708, and the P-ch transistor 708 has its source connected to the power supply voltage VDD and its drain connected to the drain of the N-ch transistor 709. The N-ch transistor 709 has its gate connected to its drain and its source grounded.

The drain of the N-ch transistor 709 is supplied as the bias voltage VBIASN to the gates of the N-ch transistor 701 in the differential circuit 3 and the N-ch transistor 706 in the output circuit 4.

As in FIG. 9, the bias circuit is designed for VBIASN that can prevent a large amount of currents from being consumed.

The P-ch transistor 609 has its source connected to the power supply voltage VDD, its gate connected to the standby control signal STBY, and its drain connected to the bias voltage VBIAS. Reference numeral 710 designates a parasitic capacitance generated in the wiring for the bias voltage signal VBIASN and represented as a capacitance value C3.

FIG. 12 is a timing chart of FIG. 11.

In a normal state, the standby control signal STBY is at an "H" level and the P-ch transistor 609 is turned off. Thus, the bias voltage VBIAS is generated and determined by the P-ch transistor 608 and resistor 610. In addition, the P-ch and N-ch transistors 708 and 709 generate the bias voltage VBIASN. The differential circuit 3 and output circuit 4 constitute a null amplifier, as in FIG. 9. Thus, if the Vin signal is input to the non-inverting input terminal V+, a voltage almost the same as Vin is generated at the output terminal Vo.

Next, the STBY signal is changed to an "L" level. Then, the P-ch transistor 609 is turned on to increase the bias voltage VBIAS up to the power supply voltage VDD. In addition, the gate voltage of the P-ch transistor 708 increases up to the power supply voltage VDD to prevent a current from flowing, thereby reducing the operating drain voltage of the N-ch transistor 709 down to VSS and thus reducing VBIASN down to VSS.

The voltage VBIASN is set at about (VSS+1 voltage) due to the low-current-consumption design. Thus, the voltage can be reduced down to VSS at a high speed depending on the designed size of the N-ch transistor 709.

At this point, the gate voltages of the N-ch transistor 701 in the differential circuit 3 and the N-ch transistor 706 in the output circuit 4 decrease down to VSS to prevent a current from flowing through the N-ch transistors 701 and 706. Thus, the differential circuit 3 and output circuit 4 consume no current and are in a standby state. The voltage at the output terminal Vo becomes indeterminate.

Next, the STBY signal is changed to an "H" level to switch the standby state to the normal operation state. This causes the P-ch transistor 609 to be turned off. VBIASN, which has decreased down to VSS, has a parasitic capacitance 710 in which charges constituting the VSS potential are accumulated. Since the resistance of the P-ch transistor 708 is set at a large value due to the low-current-consumption design, a desired amount of charges are filled in the parasitic capacitance to increase VBIASN up to the normal operating potential ($\approx$VSS+1 voltage).

DISCLOSURE OF THE INVENTION

According to the conventional differential amplifying apparatus shown in FIG. 9, however, if a large number of differential amplifying apparatuses are arranged as in a liquid crystal driving apparatus, the parasitic capacitance 611 of VBIAS may increase up to several picofarad (pF). Then, the resistor R 610 discharges the charges accumulated in the parasitic capacitance.

The resistance value R, however, is relatively large due to the low-current-consumption design, and about several microseconds ($\mu$s) is required for discharge. When the standby state is transitioned to the normal operation state and if about several $\mu$s is required to change to the normal bias voltage VBIAS, then several $\mu$s is required until the output voltage Vo becomes stabilized.

In addition, in the conventional differential amplifying apparatus shown in FIG. 11, the parasitic capacitance 710 in VBIASN is also several pF. The P-ch transistor 708 fills charges in the parasitic capacitance. Due to the low-current-consumption design, however, the resistor 610 has a relatively large resistance value, requiring about several $\mu$s for discharge, and when the standby state is transitioned to the normal operation state, several $\mu$s is required until the output voltage Vo becomes stabilized, as in FIG. 9.

Thus, if such a conventional differential amplifying apparatus is applied to a liquid crystal driving apparatus for high pixel display and if the operation frequency is about 10 $\mu$s, the above stabilization time affects image quality.

It is an object of this invention to provide a differential amplifying apparatus that can increase the operation speed at which the standby state is changed to the normal operation state and that can reduce possible distorted waves in a power transient response until the differential circuit becomes stabilized.

The differential amplifying apparatus according to this invention is characterized in that it comprises a blocking circuit operative when the standby state is changed to the normal operation state to prevent distortion in a power transient response from being output to the exterior until the bias voltage becomes stabilized; a circuit for promptly discharging a parasitic capacitance from a bias voltage line; or a circuit for promptly charging the parasitic capacitance in the bias voltage line.

This invention can increase the operation speed at which the standby state is changed to the normal operation state and that can reduce possible distorted waves in a power transient response until the differential circuit becomes stabilized.

A differential amplifying apparatus according to claim 1 is characterized in that the apparatus comprises a differential circuit for outputting a voltage corresponding to the difference between a voltage applied to a non-inverting input terminal and a voltage applied to an inverting input terminal; an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor; bias voltage generating circuits for generating a constant bias voltage that determines an operation current for the differential and output circuits; a controlling switch that varies the bias voltage of the bias generating circuit to control the operation current; a switch provided at the output of the output circuit to block a signal from the output circuit; and a delay means for delaying the control timing of the blocking switch behind the control timing of the controlling switch; wherein, an output signal is obtained from the output of the blocking switch. When the standby state is changed to the normal operation state, the output switch is opened to prevent the distortion in a power transient response from being output to the exterior until the bias voltage becomes stabilized.

A differential amplifying apparatus according to claim 2 is characterized in that the apparatus comprises a differential circuit for outputting a voltage corresponding to the difference between a voltage applied to a non-inverting input terminal and a voltage applied to an inverting input terminal; an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor; bias voltage generating circuits for generating a constant bias voltage signal that determines an operation current for the differential and output circuits; a controlling switch that varies the bias voltage of the bias generating circuit to control the operation current; a first N-ch transistor and a capacitor connected in series between the bias voltage signal and a ground; and a second N-ch transistor connected in parallel between the capacitor and the ground; wherein a control signal having the same polarity as that of a control signal controlling the controlling switch is supplied to the gate of the first N-ch transistor, while a control signal having a polarity opposite to that of the control signal controlling the controlling switch is supplied to the gate of the second N-ch transistor. Thus, the charges in the parasitic capacitance in the bias signal VBIAS are also discharged through the capacitor added separately from the resistor for the bias voltage generating circuit in order to reduce the discharge time.

A differential amplifying apparatus according to claim 3 is characterized in that the apparatus comprises a differential circuit for outputting a voltage corresponding to the difference between a voltage applied to a non-inverting input terminal and a voltage applied to an inverting input terminal; an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor; bias voltage generating circuits for generating a constant bias voltage signal that determines an operation current for the differential and output circuits; a controlling switch that varies the bias voltage of the bias generating circuit to control the operation current; a first P-ch transistor and a capacitor connected in series between the bias voltage signal and a power supply terminal; and a second P-ch transistor connected between the capacitor and the power supply terminal; wherein a control signal having a polarity opposite to that of the control signal controlling the controlling switch is supplied to the gate of the first P-ch transistor, while a standby control signal having the same polarity as that of the control signal is supplied to the gate of the second P-ch transistor. Thus, the charges in the parasitic capacitance in the bias signal are charged through the capacitor added separately from the transistor in the bias voltage generating circuit in order to reduce the charging time.

A differential amplifying apparatus according to claim 4 is characterized in that the apparatus comprises the features in both claims 2 and 3. In the case of differential circuits of a CMOS configuration, this invention can improve the transient characteristics of both a P- an N-channel differential circuits.

A differential amplifying apparatus according to claim 5 is characterized in that in claims 1 to 4, the controlling switch for varying the bias voltage of the bias generating circuit to control the operation current is operated to control the current after an output signal from the output circuit has stabilized, the controlling switch being subsequently turned off to enable operations with operation timings required for normal operations.

Specifically, if this invention is used for a liquid crystal driving apparatus, bias control is activated after the operation of the liquid crystal driving apparatus has stabilized, the bias current is then stopped for a specified period of time, and bias control is then again activated with timings required to enter an operation state. Thus, if this invention is used for a liquid crystal driving apparatus, the bias current is stopped for a specified period of time, thereby reducing power consumption.

A differential amplifying apparatus according to claim 6 is characterized in that in claims 1 to 4, the controlling switch for varying the bias voltage of the bias generating circuit to control the operation current is operated to stop or reduce the current before an output signal from the output circuit is generated, the controlling switch being subsequently turned off to enable operations with operation timings required for normal operations.

Specifically, if this invention is used for a liquid crystal driving apparatus, then within one operation cycle of the apparatus, bias control is activated before the operation of the liquid crystal driving apparatus is started, the bias current is then stopped for a specified period of time, and bias control is then again activated with timings required to enter an operation state. Thus, the bias current is stopped for a specified period of time before the operation of the differential circuit is started, so the effect of the output distortion at the start of operation is smaller than that provided by the operation timings set forth in claim 5.

BRIEF DESCRIPTION OF THE DRAWINGS

FIG. 7 shows a configuration of a liquid crystal driving apparatus using the differential amplifying apparatus according to each embodiment of this invention;

DESCRIPTION OF THE EMBODIMENTS

Embodiments of this invention are described with reference to FIGS. 1 to 8.

Figure 9:
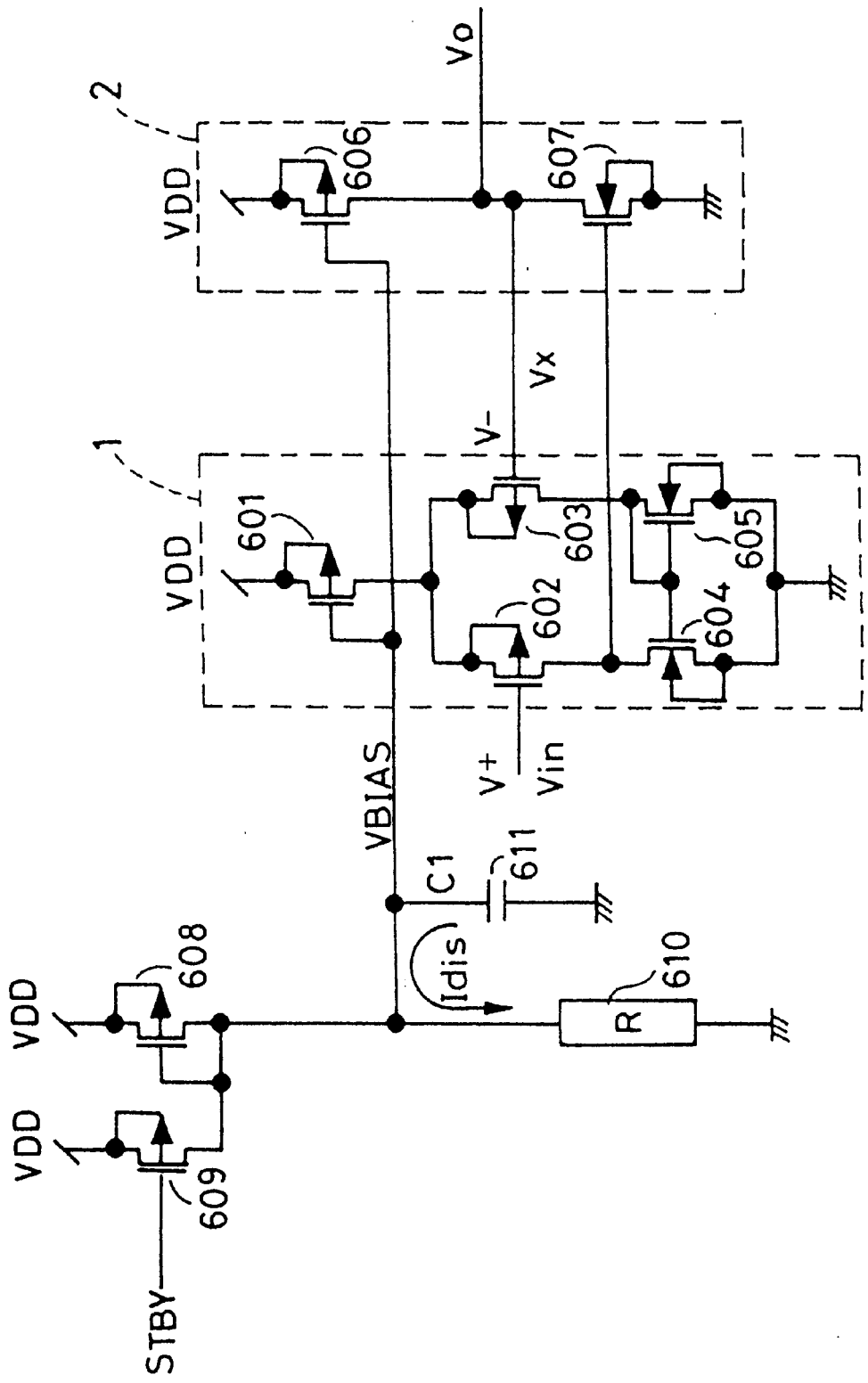
FIG. 9 shows a configuration of a conventional differential amplifying apparatus.
Figure 10:
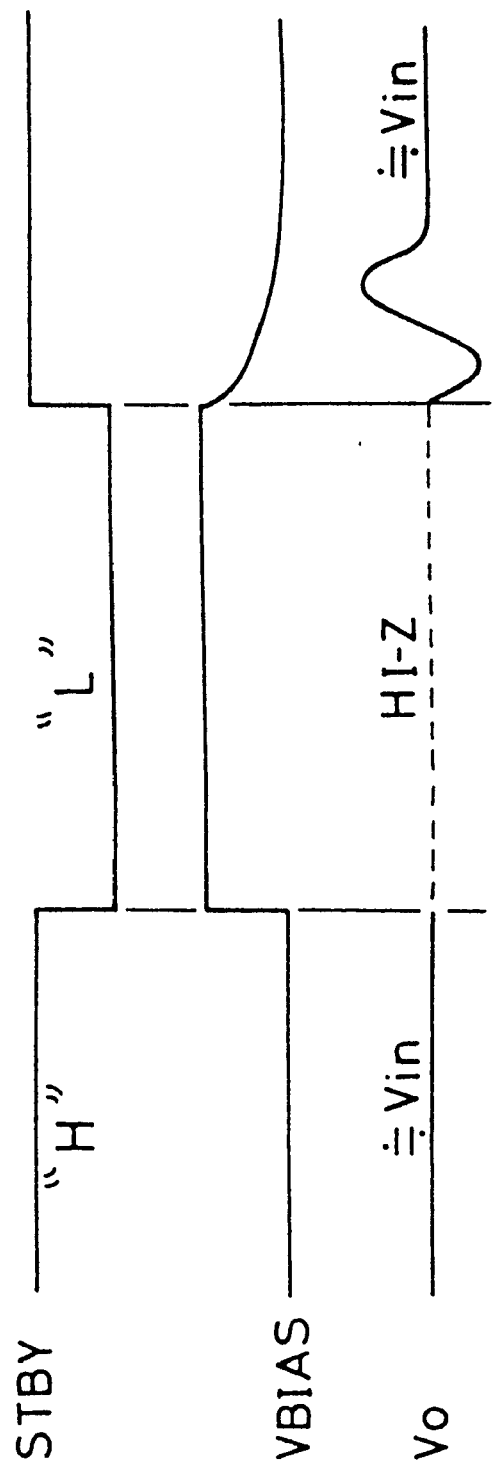
FIG. 10 is a timing chart of the conventional example.
Figure 11:
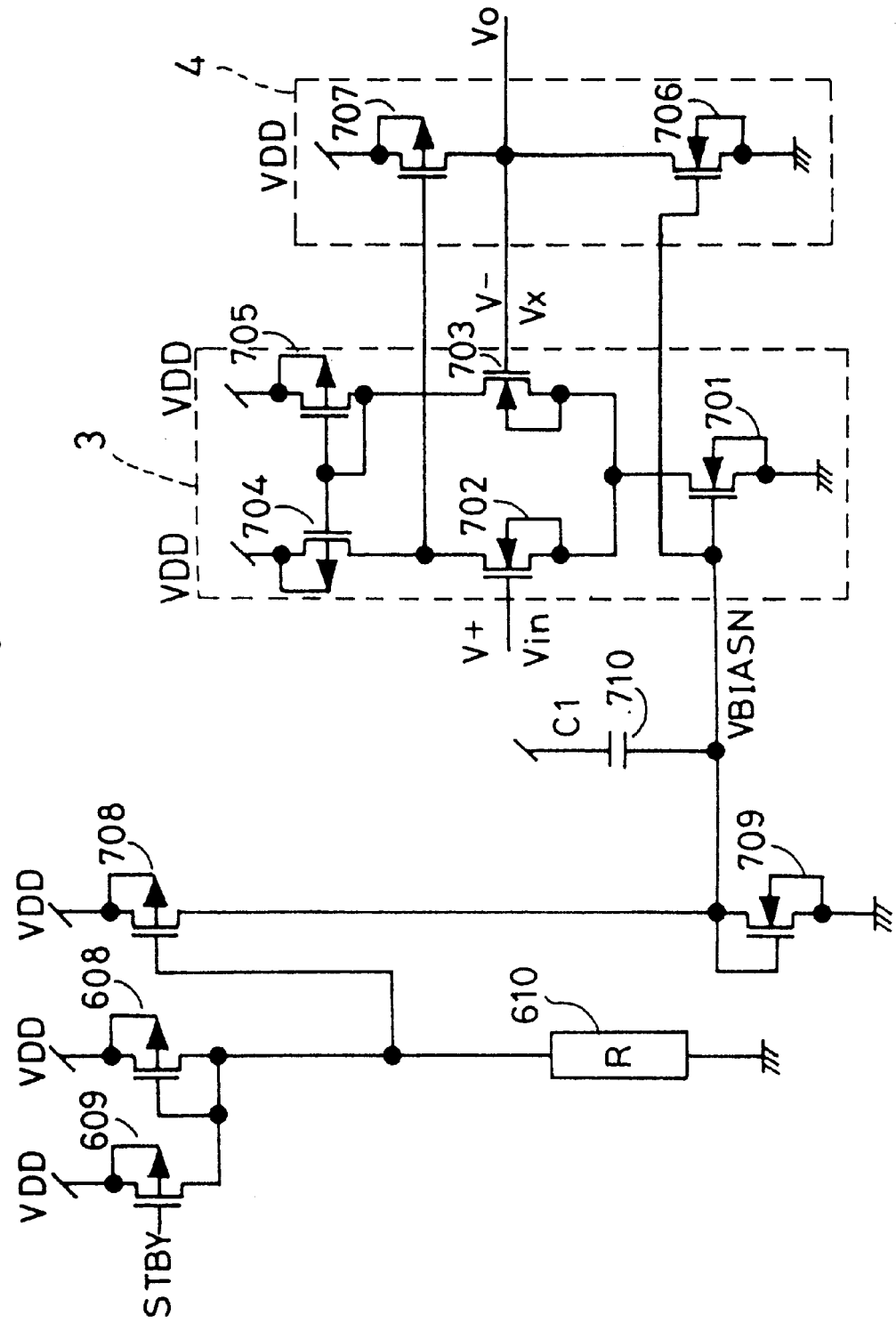
FIG. 11 shows a configuration of another conventional differential amplifying apparatus.
Figure 12:
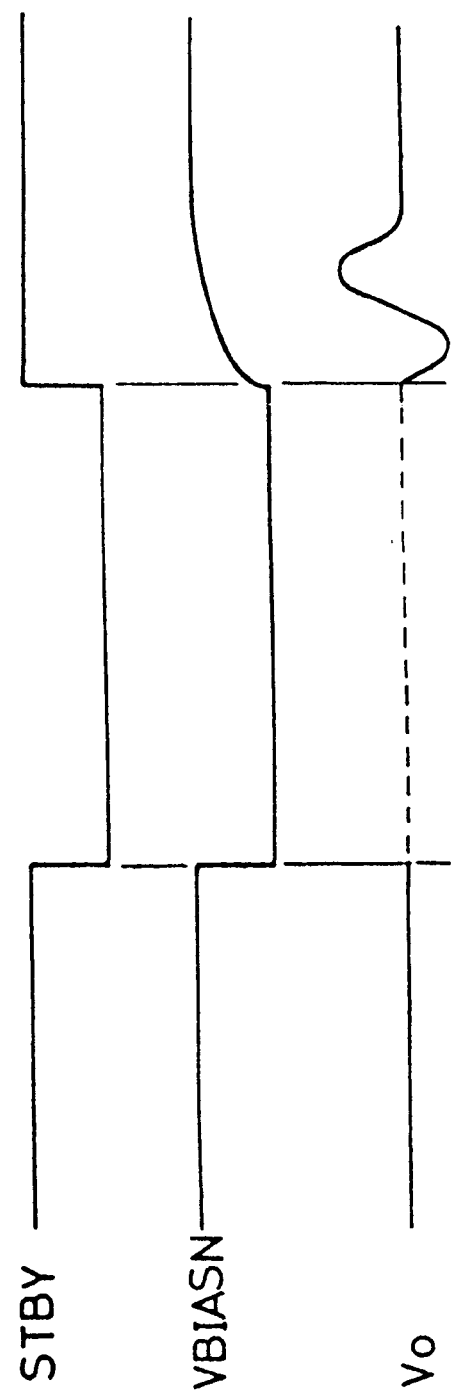
FIG. 12 is a timing chart of the conventional example.

In the following description, those components having the same effects as in FIGS. 9 and 11 showing conventional examples have the same reference numerals.

(Embodiment 1)

Figure 1:
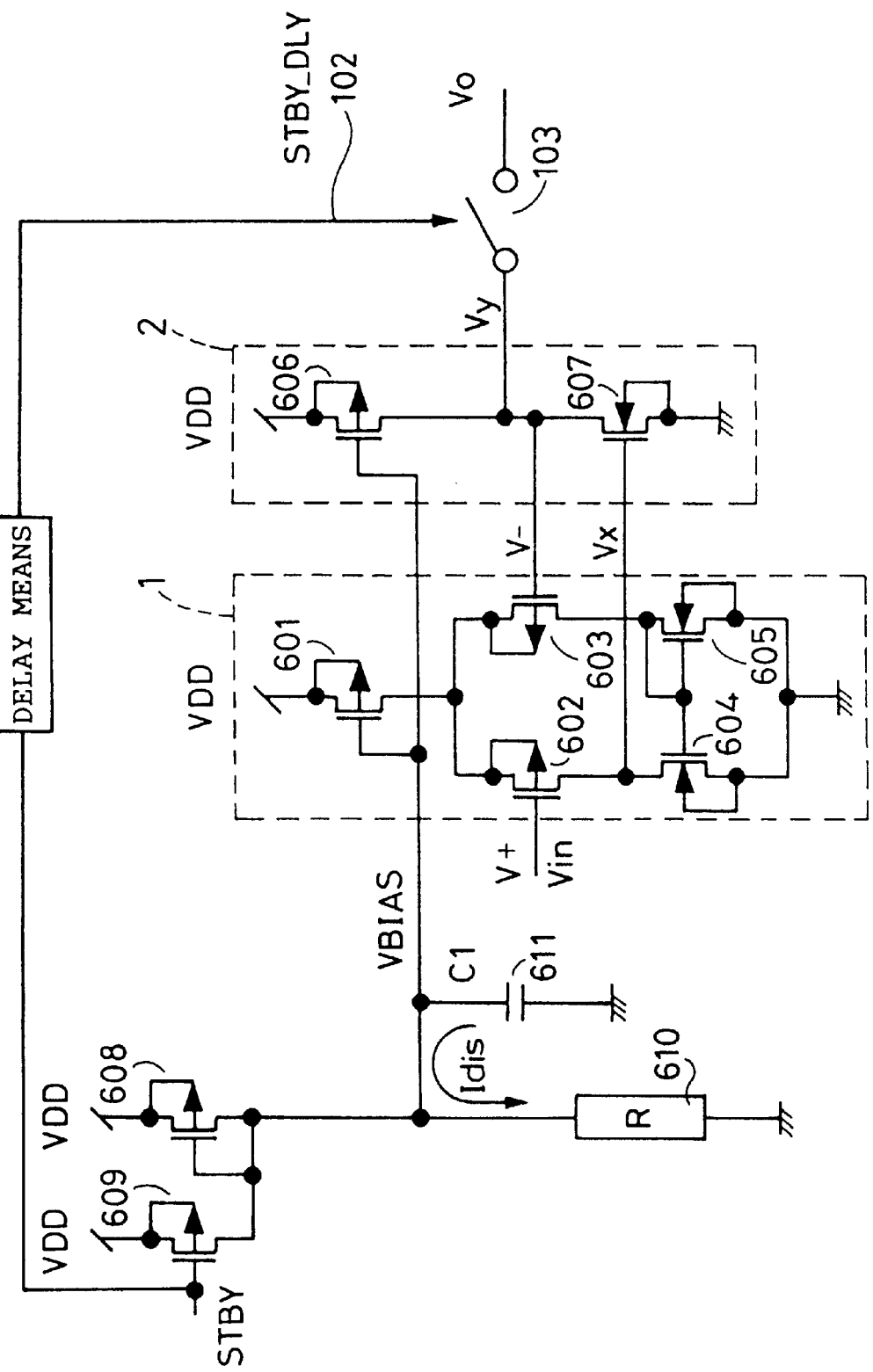
FIG. 1 shows a configuration of a differential amplifying apparatus according to Embodiment 1 of this invention.
Figure 2:
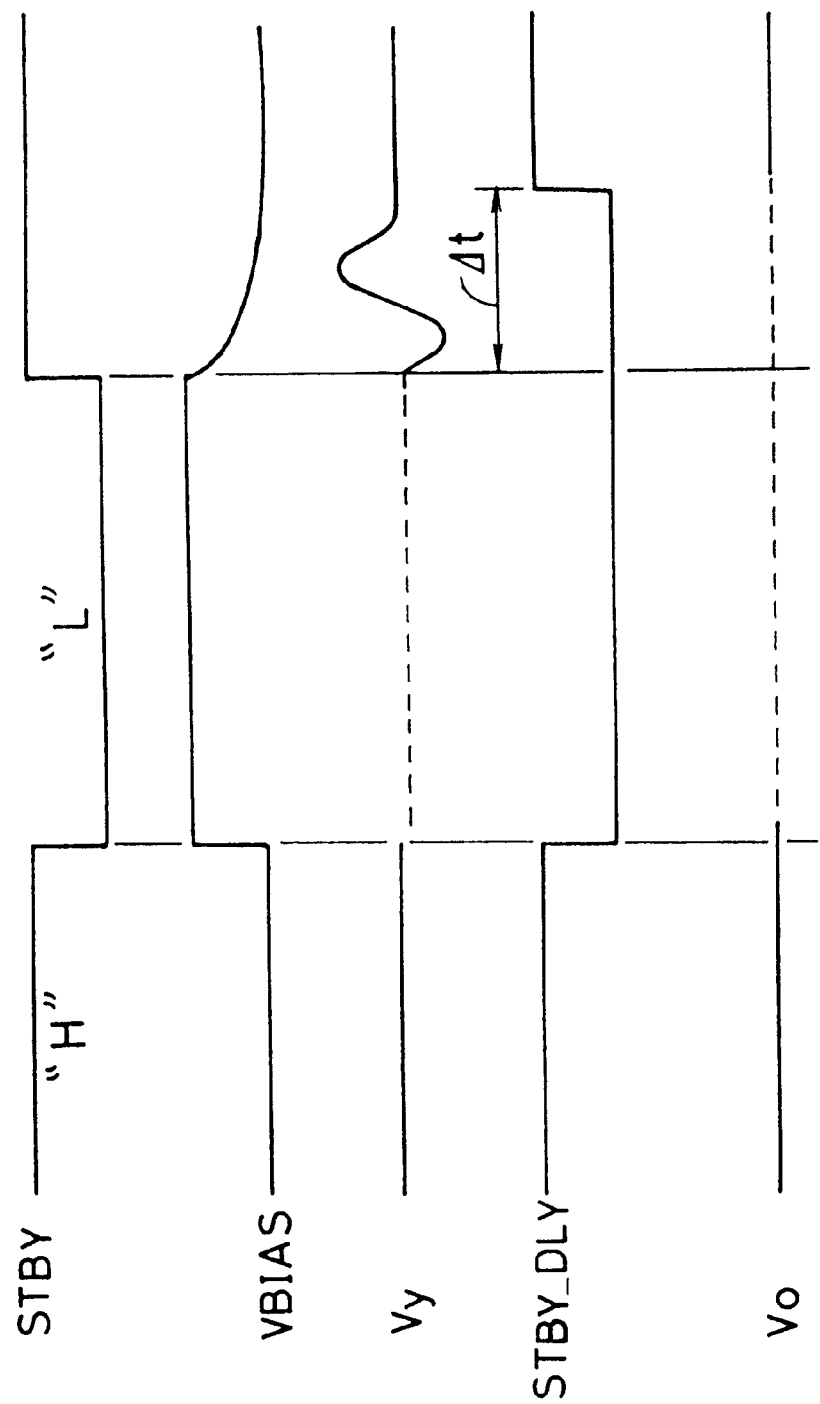
FIG. 2 is a timing chart of the integral part of Embodiment 1.

FIGS. 1 and 2 show Embodiment 1.

The differential amplifying apparatus shown in FIG. 1 includes a switch 103 between an output Vy and the output terminal Vo of the output circuit 2 in the differential amplifying apparatus shown in FIG. 9. The opening and closing of the switch 103 are controlled by the standby control signal STBY via a delay circuit 101. The standby control signal STBY operates in the same manner as in the conventional example described above to stop the bias current in order to allow the standby state to be entered.

When the standby control signal STBY changes from the normal state to the standby state, the output from the delay means 101 is changed simultaneously with STBY to avoid delay. The change in output is delayed by a specified period of time Δt only when STBY changes from the standby state to the normal state.

FIG. 2 shows a timing chart of FIG. 1.

In the normal state, the standby control signal STBY is at an "H" level and the P-ch transistor 609 is turned off. Thus, the bias voltage VBIAS is generated and determined by the P-ch transistor 608 and resistor 610.

The differential circuit 1 has the inverting input terminal V− and the non-inverting input terminal V+. The inverting input terminal is connected to the output terminal Vo, and the differential circuit 1 and output circuit 2 constitute a null amplifier. Thus, if the Vin signal is input to the non-inverting-input terminal V+, a voltage almost the same as Vin is generated at the output terminal Vo.

Next, the standby control signal STBY is changed to an "L" level. Then, the P-ch transistor 609 is turned on to increase the bias voltage VBIAS up to the power supply voltage VDD. At this point, the delay means 101 does not provide delay and opens the switch 103 with the timing when the standby control signal STBY is inverted from "H" level to "L" level. Thus, the output terminal enters a high impedance state.

The voltage VBIAS is set at about (VDD−1 voltage) due to a low-current-consumption design. Thus, due to the small potential difference of 1 V, the voltage can increase up to the power supply voltage at a high speed depending on the designed size.

At this point, the gate voltages of the P-ch transistor 601 in the differential circuit 1 and the P-ch transistor 606 in the output circuit 2 increase up to the power supply voltage VDD to prevent a current from flowing through the transistors 601 and 606.

Thus, the differential circuit 1 and output circuit 2 consume no current and are in a standby state. In addition, the voltage at the output terminal Vy becomes indeterminate, and Vo is in the high impedance state because the switch 103 is turned off.

Next, the standby control signal STBY is changed to an "H" level to switch the standby state to the normal operation state. This causes the P-ch transistor 609 to be turned off. VBIAS, which has increased up to the power supply voltage, has the parasitic capacitance 611 in which charges constituting the power supply potential are accumulated. The resistor 610 discharges the charges accumulated in the parasitic capacitance 611 in the direction shown by arrow Idis and reduces VBIAS down to the normal operation potential (≈VDD−1 voltage).

Since the element that discharges the charges accumulated in the parasitic capacitance has a relatively large resistance value R, several μs is required for the bias voltage to change to the normal value. In this case, the output Vy of the output circuit 2 may be distorted due to the unstable state of the bias voltage.

The delay means 101 is composed of an logical control circuit or a combination of a logical control circuit and a delay element that uses a CR time constant so that the switch 103 is closed after a specified period of time Δt which was determined at the time of design. By setting this specified period of time at a value that allows Vy to converge, no distorted waveform is output to the output terminal Vo.

If this embodiment is used for a liquid crystal driving apparatus, a capacitive load of several 10 to several 100 pF is connected to Vo (not shown). Thus, in the standby state, a constant voltage is charged in the load capacitance, thereby preventing the output voltage from significantly varying despite a high impedance.

Although Embodiment 1 has been described in conjunction with the differential circuit 1 and output circuit 2 having the same configuration as in FIG. 9, the same effects can be obtained by combining together the differential circuit 3 and output circuit 4 in FIG. 11 that use N channels as bias transistors and combining the delay means 101 and switch 103 together. Furthermore, a CMOS-type differential amplifying apparatus can be configured by combining FIGS. 9 and 11 together and combining the delay means 101 and switch 103 together.

(Embodiment 2)

Figure 3:
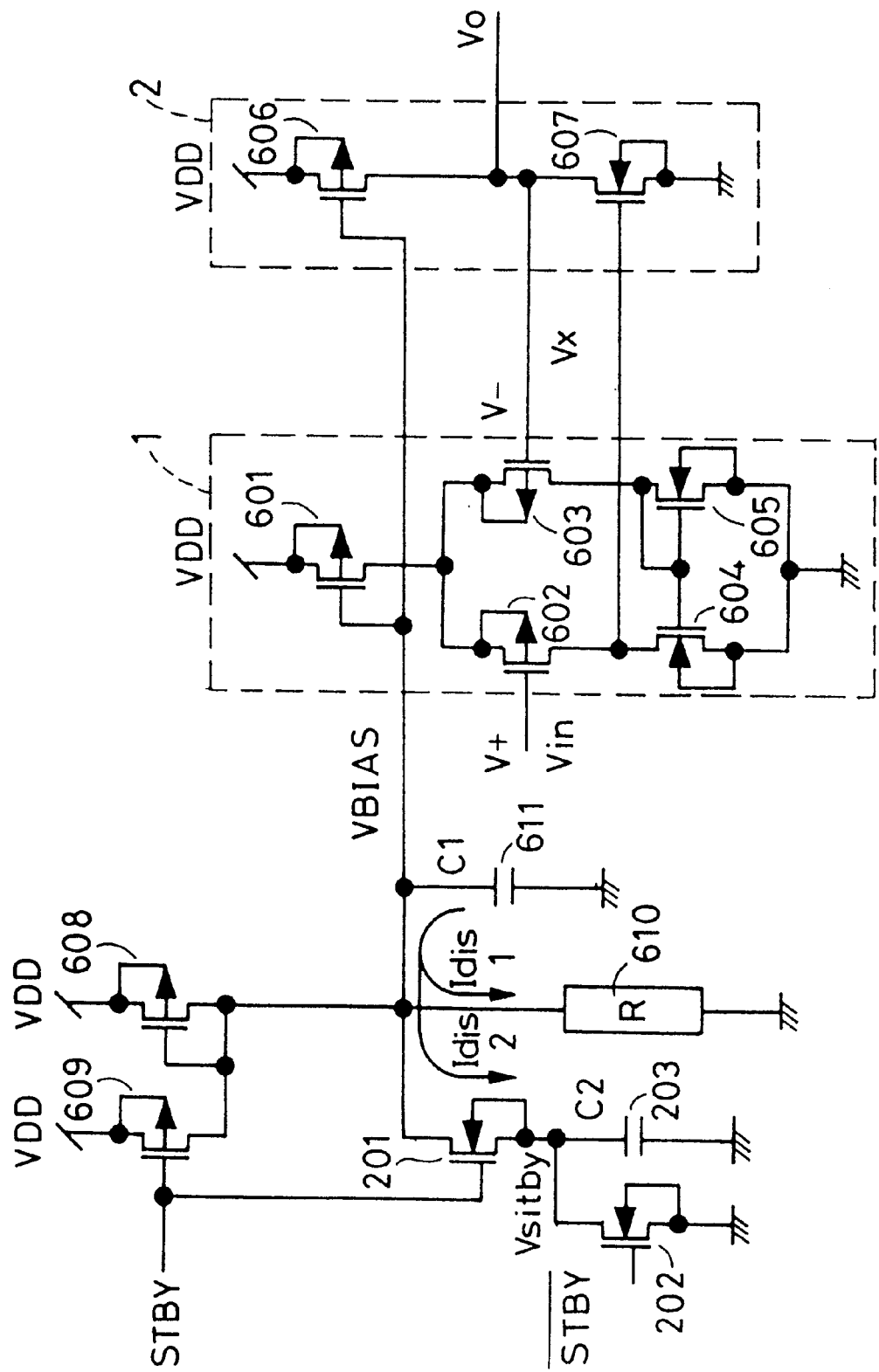
FIG. 3 shows a configuration of a differential amplifying apparatus according to Embodiment 2 of this invention.
Figure 4:
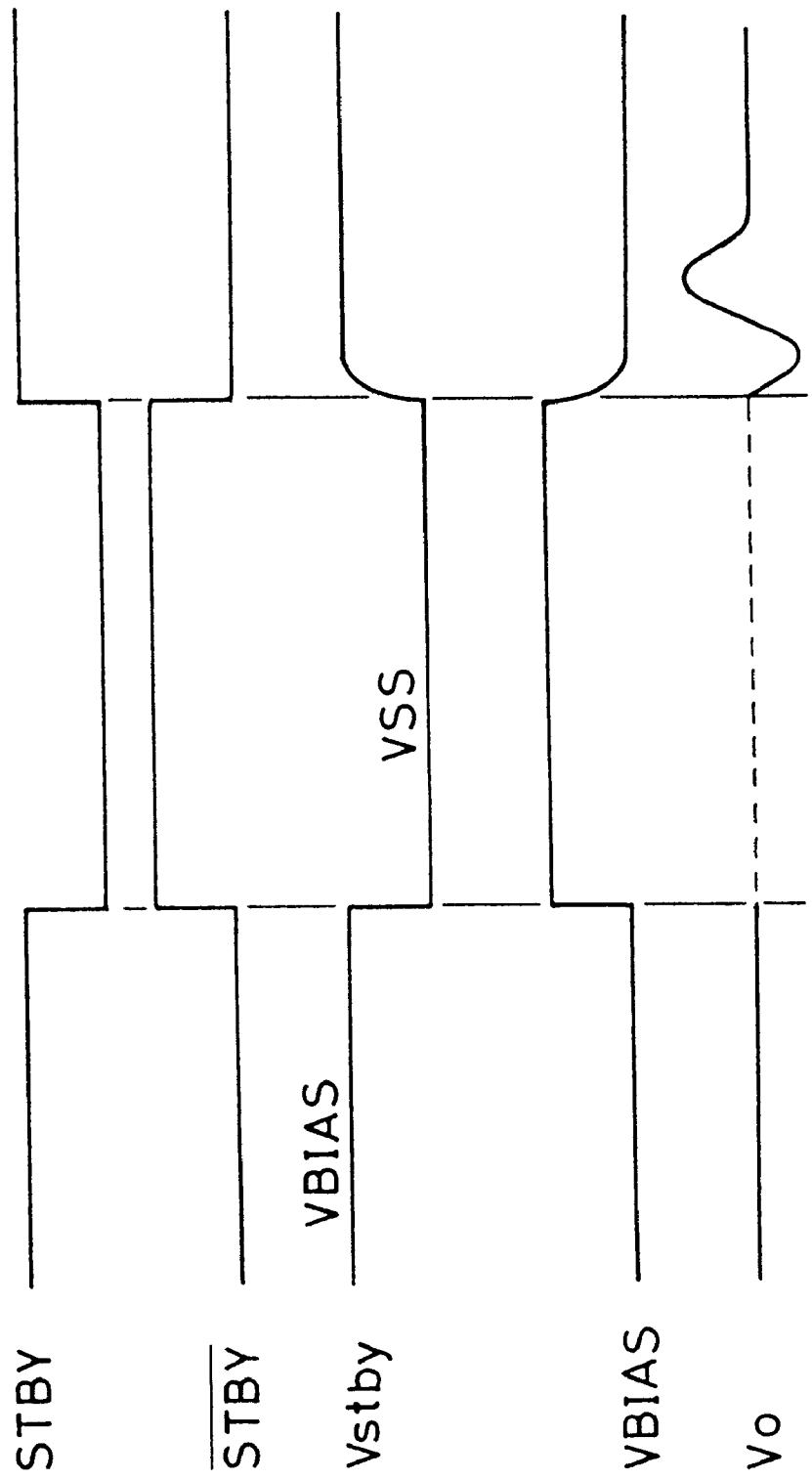
FIG. 4 is a timing chart of the integral part of Embodiment 2.

FIGS. 3 and 4 show Embodiment 2.

This differential amplifying apparatus is configured by adding a discharge circuit consisting of N-ch transistors 201 and 202 and a capacitor 203, to the bias signal VBIAS line of the differential amplifying apparatus shown in FIG. 9.

The N-ch transistor 201 has its drain connected to the bias signal VBIAS, its gate connected to the standby control signal STBY, and its source grounded via the capacitor 203.

The drain of the N-ch transistor 202 is connected to the source of the N-ch transistor 201, a signal having a polarity opposite to that of the standby control signal STBY is applied to its gate, and its source is grounded.

FIG. 4 shows a timing chart of FIG. 3.

In a normal state, the standby control signal STBY is at the "H" level and the P-ch transistor 609 is turned off. Thus, the bias voltage VBIAS is generated and determined by the P-ch transistor 608 and resistor 610.

The differential circuit 1 has the inverting input terminal V− and the non-inverting input terminal V+. The inverting input terminal is connected to the output terminal Vo, and the differential circuit 1 and output circuit 2 constitute a null amplifier. Thus, if the Vin signal is input to the non-inverting input terminal V+, a voltage almost the same as Vin is generated at the output terminal Vo.

The gate potential of the N-ch transistor 201 is the same as the potential of the standby control signal STBY, so the transistor 201 is turned on. Thus, the voltage of the bias signal VBIAS is applied to the capacitor 203, and an amount of charges corresponding to the bias potential have been accumulated.

The gate potential of the N-ch transistor 202 has a polarity opposite to the potential of the standby control signal STBY, so the transistor 202 is turned off. Thus, the charges in the capacitor 203 are held without being discharged.

Next, the standby control signal STBY is changed to an "L" level. Then, the P-ch transistor 609 is turned on to increase the bias voltage VBIAS up to the power supply voltage VDD. Thus, the gate of the N-ch transistor 201 is turned off to disconnect the bias signal VBIAS from the capacitor 203, thereby preventing the bias signal VBIAS from being affected. Due to a polarity opposite to that of the standby control signal STBY, the gate of the N-ch transistor 202 is changed to the "H" level, and the N-ch transistor 202 is turned on. At this point, the charges accumulated in the capacitor 203 are discharged to VSS through the N-ch transistor 202.

The voltage VBIAS is set at about (VDD−1 voltage) due to the low-current-consumption design. Thus, due to the small potential difference of 1 V, the voltage can be increased up to the power supply voltage at a high speed depending on the designed size of the P-ch transistor 609. This is the same as in the conventional example.

At this point, the gate voltages of the P-ch transistor 601 in the differential circuit 1 and the P-ch transistor 606 in the output circuit 2 increase up to the power supply voltage VDD to prevent a current from flowing through the transistors 601 and 606. In this state, the differential circuit 1 and output circuit 2 consume no current and are in the standby state.

Next, the standby control signal STBY is changed to the "H" level to switch the standby state to the normal operation state. This causes the P-ch transistor 609 to be turned off. VBIAS, which has increased up to the power supply voltage, has the parasitic capacitance 611 in which charges constituting the power supply potential are accumulated. The resistor 610 discharges the charges accumulated in the parasitic capacitance and reduces VBIAS down to the normal operation potential (≈VDD−1 voltage).

Since the element that discharges the charges accumulated in the parasitic capacitance has a relatively large resistance value R, several μs is required for the bias voltage to change to the normal value.

Since, however, the N-ch transistor 201 is turned on while the N-ch transistor 202 is turned off to connect the bias signal VBIAS terminal with the capacitor 203 from which the charges have been discharged, the charges accumulated in the capacitance C1 of the parasitic capacitance 611 are discharged through the resistor 610 and capacitor 203. The discharge time can be sufficiently reduced by appropriately setting the size of the capacitor 203.

Once the charges have been sufficiently discharged to allow the bias signal to reach a desired VBIAS value, the current is stopped by filling the capacitor 203 with charges in the normal state, thereby preventing unwanted current consumption.

The reason why the capacitor 203 is provided is described in detail and an appropriate capacitance value C2 of the capacitor 203 relative to the capacitance value C1 of the parasitic capacitance 611 is also described.

The methods for promptly reducing the potential of the parasitic capacitance 611 in which charges of the power supply potential (VDD) are accumulated include the following two methods in addition to the parallel connection of the capacitor 203. This arrangement is preferable for the following reason.

(First method) Discharging is carried out through the resistor connected parallel with the parasitic capacitance 611. In this case, the time constant is large and the convergence is slow.

(Second method) The parasitic capacitance 611 is short-circuited. In this case, the potential of the parasitic capacitance 611 decreases rapidly down to 0 V. This method is not preferable because the constant-current source composed of the P-ch transistor 608 is attached to the charging circuit for the parasitic capacitance 611, thereby requiring a large amount of time to charge the parasitic capacitance 611 next time.

Consequently, the arrangement is preferable in which the capacitor 203 is connected parallel with the parasitic capacitance 611.

The appropriate capacitance value C2 of the capacitor 203 relative to the capacitance value C1 of the parasitic capacitance 611 can be expressed as follows.

$$C1 \cdot VDD = (C1+C2) \cdot VBIAS$$

$$C1 \cdot VDD = C1 \cdot VBIAS + C2 \cdot VBIAS$$

$$C2 = (VDD - VBIAS) \cdot C1/VBIAS$$

Specific numerical values are substituted for the symbols: VDD=5 volatage and VBIAS=4 voltage. If this embodiment is applied to a TFT liquid crystal driving circuit, 300 to 400 differential amplifying apparatuses 611 are connected to the bias voltage VBIAS line, so if the capacitance value C1 of the parasitic capacitance 401 is 70 pF, C2≈17.5 pF is appropriate.

(Embodiment 3)

Figure 5:
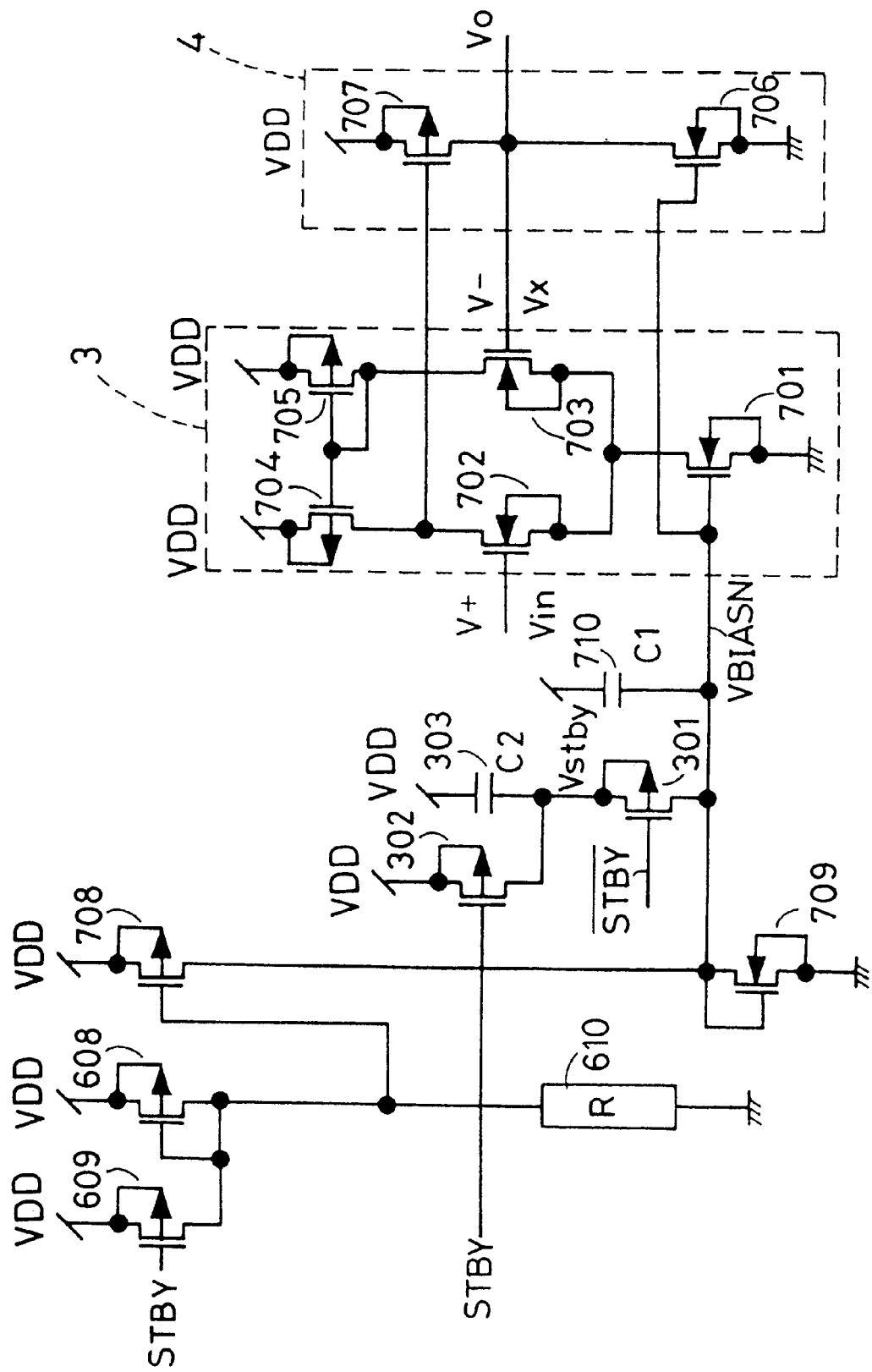
FIG. 5 shows a configuration of a differential amplifying apparatus according to Embodiment 3 of this invention.
Figure 6:
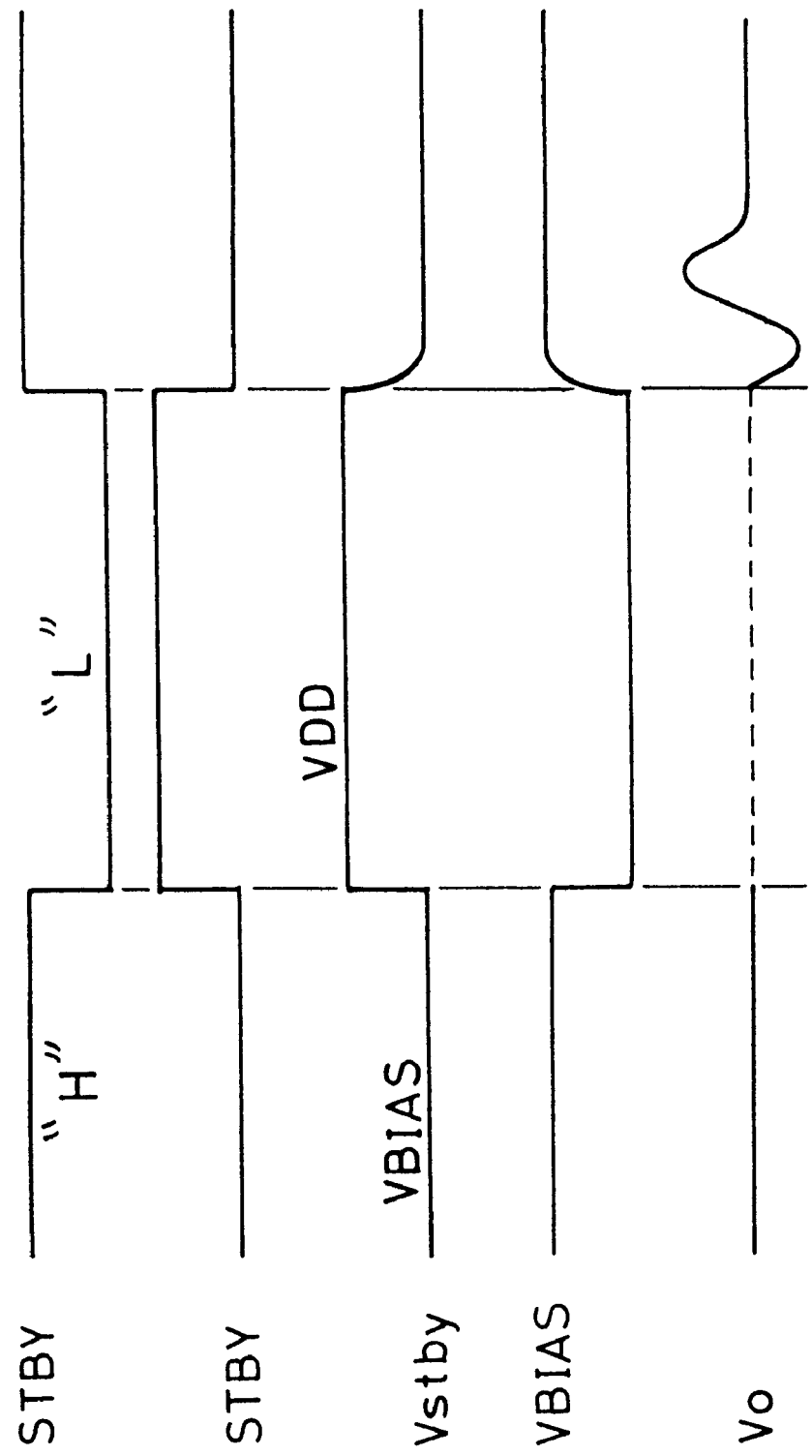
FIG. 6 is a timing chart of the integral part of Embodiment 3.
Figure 8A:
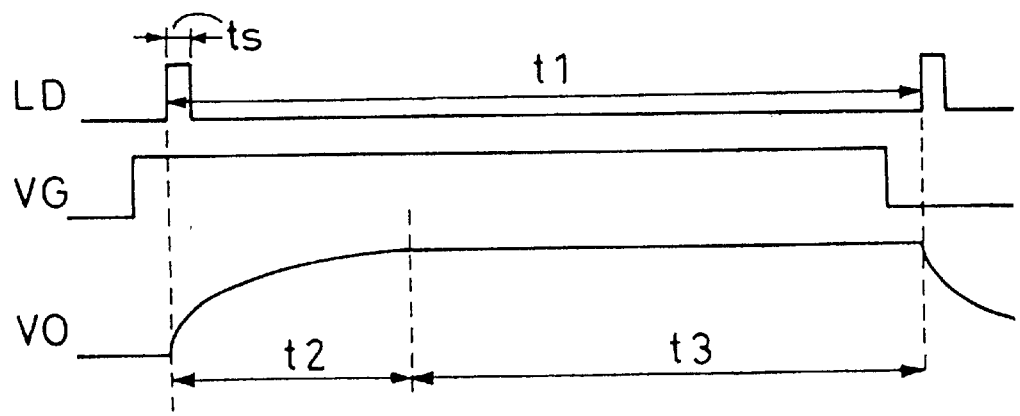
FIG. 8 shows timing charts for a comparative example and Embodiments 1 to 3.
Figure 8B:
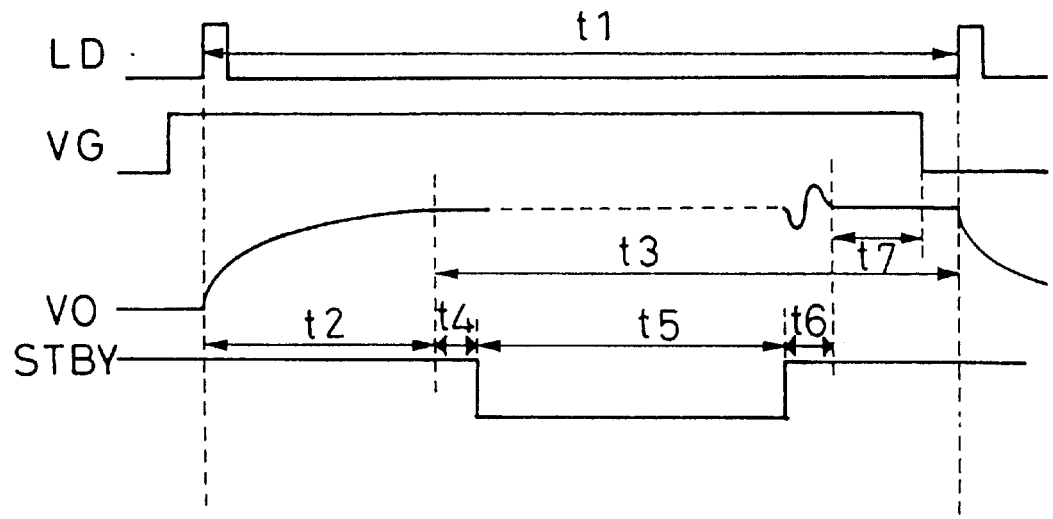
Figure 8C:
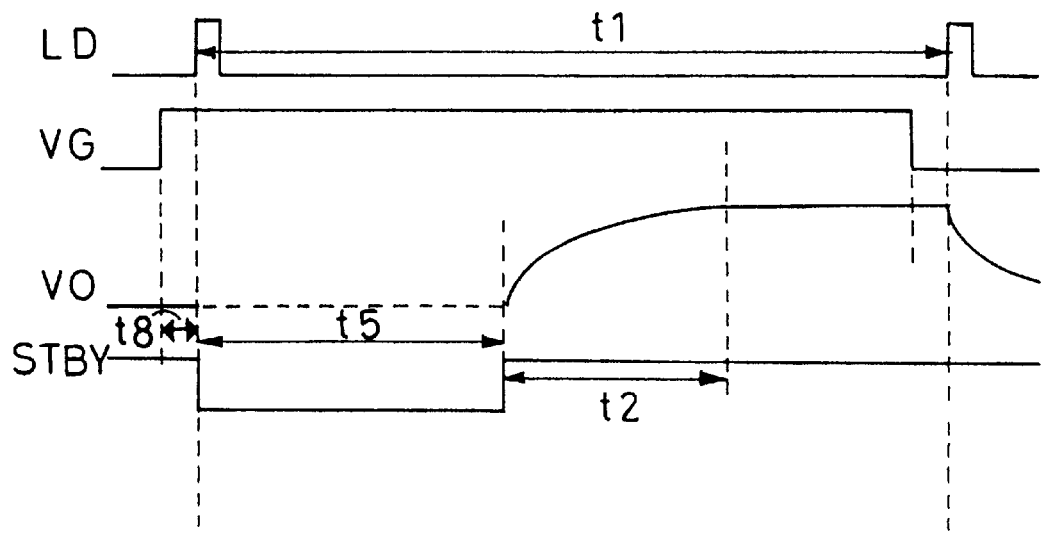

FIGS. 5 and 6 show Embodiment 3.

This differential amplifying apparatus is configured by adding a charging circuit consisting of P-ch transistors 301 and 302 and a capacitor 303, to the bias signal VBIAS line of the differential amplifying apparatus shown in FIG. 11.

The P-ch transistor 301 has its drain connected to the bias signal VBIASN, its gate connected to a standby control signal having a polarity opposite to that of the standby control signal STBY, and its source connected to the power supply voltage VDD via the capacitor 303.

The P-ch transistor 302 has its drain connected to the source of the P-ch transistor 301, its gate connected to a signal having the same polarity as that of the standby control signal STBY, and its source connected to the power supply voltage VDD.

FIG. 6 shows a timing chart of FIG. 5.

In a normal state, the standby control signal STBY is at the "H" level and the P-ch transistor 609 is turned off. Thus, the bias voltage VBIAS is generated and determined by the P-ch transistor 608 and resistor 610.

In addition, the P-ch and N-ch transistors 708 and 709 generate the bias voltage VBIASN. The differential circuit 1 has the inverting input terminal V− and the non-inverting input V+. The inverting input terminal is connected to the output terminal Vo, and the differential circuit 1 and output circuit 2 constitute a null amplifier. Thus, if the Vin signal is input to the non-inverting input terminal V+, a voltage almost the same as Vin is generated at the output terminal Vo.

The gate potential of the P-ch transistor 301 has a polarity opposite to that of the standby control signal STBY, so the transistor 301 is turned on. Thus, the voltage of the bias signal VBIASN is applied to the capacitor 303, and an amount of charges corresponding to the bias potential have been accumulated.

The gate potential of the P-ch transistor 302 has the same polarity as that of the standby control signal STBY, so the transistor 302 is turned off. Thus, the charges in the capacitor 303 are held without being discharged.

Next, the standby control signal STBY is changed to the "L" level. Then, the P-ch transistor 609 is turned on to increase the bias voltage VBIAS up to the power supply voltage VDD. In addition, the bias voltage VBIASN decreases down to VSS.

The gate of the P-ch transistor 301 is turned off to disconnect the bias signal VBIASN from the capacitor 303, thereby preventing the bias signal VBIASN from being affected.

Due to the same polarity as that of the standby control signal STBY, the gate of the P-ch transistor 302 is changed to the "L" level, and the P-ch transistor 302 is turned on. At this point, the charges accumulated in the capacitor 303 are discharged to the power supply voltage VDD through the P-ch transistor 302.

The voltage VBIASN is set at about (VSS+1 voltage) due to the low-current-consumption design. Thus, due to the small potential difference of 1 V, the voltage can decrease down to VSS at a high speed depending on the designed size of the N-ch transistor 709. This is the same as in the conventional example.

At this point, the gate voltages of the P-ch transistor 701 in the differential circuit 1 and the P-ch transistor 706 in the output circuit 2 decrease down to VSS to prevent a current from flowing through the transistors 701 and 706. In this state, the differential circuit 1 and output circuit 2 consume no current and are in the standby state.

Next, the standby control signal STBY is changed to the "H" level to switch the standby state to the normal operation state. This causes the P-ch transistor 609 to be turned off. VBIASN, which has decreased down to VSS, has the parasitic capacitance 710 in which charges constituting the power supply potential difference are accumulated.

When the standby control signal STBY is changed to the "H" level, the P-ch transistor 708 is turned off to fill in the signal the charges accumulated in the parasitic capacitance in order to increase VBIASN up to the normal operation potential (≈VSS+1 voltage).

Since the element that fills the charges accumulated in the parasitic capacitance is the P-ch transistor 708 having a relatively large resistance, several μs is required for the bias voltage to change to the normal value.

Since, however, the P-ch transistor 301 is turned on while the P-ch transistor 302 is turned off to connect the bias signal VBIASN terminal with the capacitor 303 in which the charges have been filled, the charges accumulated in the parasitic capacitance 710 are filled in the signal from the power supply voltage VDD through the P-ch transistor 708 and capacitor 303.

The charge time can be sufficiently reduced by appropriately setting the size of the capacitor.

Once sufficient charging has been completed to allow the bias signal to reach a desired VBIASN value, the current is stopped by filling the capacitor 303 with charges in the normal state, thereby preventing unwanted current consumption.

(Embodiment 4)

By combining the differential amplifying apparatus according to Embodiment 2 with the differential amplifying apparatus according to Embodiment 3 to configure a CMOS-type differential amplifying apparatus, the transient characteristics of both P- and N-channel differential circuits can be improved at a high speed.

Specifically, this differential amplifying apparatus comprises a CMOS-type differential circuit for outputting a voltage corresponding to the difference between a voltage applied to a non-inverting input terminal and a voltage applied to an inverting input terminal; an output circuit consisting of a series circuit comprising a constant-current source transistor that allows a constant current to flow and a controlling transistor that controls a current depending on the output voltage from the differential circuit, the output circuit having an output terminal at a connection point between the constant-current source transistor and the controlling transistor; a P-ch and an N-ch transistor bias voltage generating circuits for generating a constant bias voltage that determines an operation current for the CMOS-type differential and output circuits; a controlling switch that varies the bias voltages of the P-ch and N-ch transistor bias voltage generating circuits to control the operation current; a first N-ch transistor (201) and a first capacitor (203) connected in series between the P-ch transistor bias voltage signal and a ground; a second N-ch transistor (202) connected in parallel between the first capacitor (203) and the ground; a first P-ch transistor (301) and a second capacitor (303) connected in series between the N-ch transistor bias voltage signal and a power supply terminal; and a second P-ch transistor (302) connected between the second capacitor (303) and the power supply terminal. A control signal having the same polarity as that of a control signal controlling the controlling switch is supplied to the gate of the first N-ch transistor (201), a control signal having a polarity opposite to that of the control signal controlling the controlling switch is supplied to the gate of the second N-ch transistor (202), a control signal having a polarity opposite to that of the control signal controlling the controlling switch is supplied to the gate of the first P-ch transistor (301), and a control signal having the same polarity as that of the control signal controlling the controlling switch is supplied to the gate of the second P-ch transistor (302).

EXAMPLE

An example in which the differential amplifying apparatus according to each of the above embodiment is applied to a liquid crystal driving apparatus is described with reference to FIGS. 7 and 8(a) to (c).

In FIG. 7, 401 is a differential amplifying apparatus according to each of the above embodiments; 402 is a voltage selection circuit for selecting a reference voltage as required which is input to the differential amplifying apparatus 401; 403 is a signal LD that is input to the voltage selection circuit 402 to control the switching of the voltage; 404 is a liquid crystal panel in which as many TFT arrays as the pixels are arranged; 405 is a gate signal generating section for outputting a TFT gate signal for vertical scanning; 406 is an analog signal Vo output from the differential amplifying apparatus 401; 407 is a gate signal VG from the gate signal generating section 405; and 408 is a standby control signal STBY for the differential amplifying apparatus 401.

COMPARATIVE EXAMPLE

FIG. 8(*a*) shows an operation timing chart of FIG. 7 without the use of the standby control signal STBY.

When the voltage selection circuit 402 selects a voltage to input to the differential amplifying apparatus 401 and the LD 403 to input for control is switched to the "H" level, analog output is generated as the output Vo of the differential amplifying apparatus 401.

When LD signals are sequentially input, the state of the output Vo from the differential amplifying apparatus 401 varies. When the operation cycle of LD is defined as t1, t1 corresponds to one horizontal operation cycle.

The output Vo from the differential amplifying apparatus 401 is provided during a transient response time t2 that is determined by the load time constant of the TFT panel 404 that is a load and by the driving capability of the differential amplifying apparatus 401.

The gate control signal VG 407 is switched to the "H" level to turn on the gate of a TFT transistor 409 in the TFT panel 404 in order to charge the analog signal Vo 406 in the liquid crystal capacitor 410.

The analog signal Vo 406 must change the gate signal VG 407 to the "L" level and then turn it off before the LD signal 403 changes. FIG. 8(*a*) shows that the analog signal Vo 406 reaches a target at t2.

As a result, the remaining part t3 of the one horizontal cycle t1 is ineffective as charge time for the liquid crystal panel 404.

Example 1

The operation timing chart in FIG. 8(*b*) shows an example that uses the standby control signal STBY.

One operation cycle is t1, as in FIG. 8(*a*). In addition, the analog signal Vo 406 becomes stabilized at t2, as in FIG. 8(*a*). t4 (t4 may be zero) after the analog signal has stabilized, the standby signal STBY becomes active.

The standby signal can be activated during the period of time t2. However, during the period of time t2 corresponding to the transient response of the analog signal, the load of the TFT panel 404 is not sufficiently or evenly charged because the load capacitance of the TFT panel 404 is physically and geometrically distributed over the display screen. If the standby state is then entered, the charges are redistributed inside the load of the panel to cause the signal to be reflected or a standing wave to be generated, resulting in distortion. The distortion may cause unwanted radiation, so the standby signal is desirably activated after the analog signal has stabilized.

Once the control signal STBY has become active, the current through the differential amplifying apparatus 401 is stopped to cause the apparatus to enter the standby state. The control signal STBY is controlled so as to remain at the "H" level for a specified period of time tS before recovering the normal operation state.

In the standby state, the analog output signal Vo from the differential amplifying apparatus is indeterminate, but the potential charged in the load capacitance of the TFT panel is maintained.

Since the current is stopped for a period of time t5 within the basic operation cycle t1, the current can be reduced by the amount corresponding to the ratio t5/t1.

When the normal state is entered, a voltage that is determined by the voltage selection circuit 402 is again output. Then, the analog output signal may be distorted as the bias voltage varies, but a distortion time t6 is very short because the present differential amplifying apparatus reduces the distortion compared to the conventional differential amplifying apparatuses. A timing t7 is a hold time that lasts until the gate signal is turned off. In the conventional differential amplifying apparatuses, if the distortion is large, only a short time is left for t7 and the display quality may be degraded.

By applying the differential amplifying apparatuses according to Embodiment 1 shown in FIG. 1 and its variation to a liquid crystal driving apparatus as shown in Embodiment 1, the delay means 101 prevents the distortion from leaking to the exterior or only slight distortion occurs due to noise during the opening and closing of the switch 103, thereby providing excellent image display.

By applying the differential amplifying apparatuses according to Embodiment 2 shown in FIG. 3, Embodiment 3 shown in FIG. 5, or Embodiment 4 and their variation to a liquid crystal driving apparatus as shown in Embodiment 1, at least one of the charge and discharge circuits is added to reduce the variation time of the bias voltage and thus the above distortion in order to reduce the distortion time t6 compared to the prior art, thereby providing an excellent liquid crystal driving apparatus that can restrain the display quality from being degraded.

Example 2

FIG. 8(*c*) shows Example 2.

Although the standby signal STBY in FIG. 8(*b*) showing Example 1 is activated at t2 when the analog signal Vo has stabilized, Example 2 inputs the analog signal LD 403, then inputs the standby signal to stop the current before the output of the analog signal is started, and after the period of time t5 has passed, outputs the analog signal.

Using this timing, the distortion time t6 shown in FIG. 8(*b*) is absorbed into the analog output period t2. Thus, the time t6 does not externally appear as distortion but is included in t2 that dominates the transient response time.

t8 may vary between t5' and t5. The falling edge between the H and "L" levels of the standby signal STBY need not occur at the same as the rising edge between the L and "H" levels of the signal LD.

Thus, according to the operation timing of the differential amplifying apparatus 401 of this invention, after the gate signal has been switched to the "H" level, the standby signal is activated before the analog signal is output. Accordingly, the distortion can be further reduced to provide a liquid crystal driving apparatus that consumes only a small amount of currents.

By applying the differential amplifying apparatuses according to Embodiment 1 shown in FIG. 1 and its variation, and the differential amplifying apparatuses according to Embodiment 2 shown in FIG. 3, Embodiment 3 shown in FIG. 5, or Embodiment 4 and their variation to a liquid crystal driving apparatus as shown in Example 2, either the delay means 101 or the charge and discharge circuits is added to reduce the distortion at the output terminals of the differential amplifying apparatus in order to provide an excellent liquid crystal driving apparatus in which the transient response from the standby state to the normal state is unlikely to be distorted compared to the prior art, in which the output signal stabilizes quickly, and that can restrain the display quality from being degraded.

As is apparent from each of the above embodiments, the configuration of each of the claims of this invention provides the following special effects.

According to the differential amplifying apparatus set forth in claim 1, the appropriate delay means delays the leakage of output distortion occurring when the standby state is switched to the normal operation state, thereby reducing distortion.

According to the differential amplifying apparatus set forth in claim 2, when the standby state is switched to the normal operation state, the P-ch transistor and capacitor that facilitate the transient response of the bias voltage VBIAS are used to improve the convergence time in order to provide fast operations.

According to the differential amplifying apparatus set forth in claim 3, when the standby state is switched to the normal operation state, the N-ch transistor and capacitor that facilitate the transient response of the bias voltage VBIASN are used to improve the convergence time in order to provide fast operations.

According to the differential amplifying apparatus set forth in claim 4, when the standby state is switched to the normal operation state, the P-ch and N-ch transistors and capacitor that facilitate the transient response of the bias voltages VBIAS and VBIASN are used to improve the convergence time in order to provide fast operations.

According to the differential amplifying apparatus set forth in claim 5, the analog signal is output, the normal operation timing is then changed to the standby state, which is then changed to the normal operation state, thereby reducing the current consumption.

According to the differential amplifying apparatus set forth in claim 6, the standby state is entered before the analog signal is output, and the standby state is then changed to the normal operation state, thereby reducing the current consumption.

We claim:

1. A differential amplifying apparatus comprising:
   a differential circuit for outputting a voltage corresponding to the difference between a voltage applied to a non-inverting input terminal and a voltage applied to an inverting input terminal;
   an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor;
   bias voltage generating circuits for generating a constant bias voltage that determines an operation current for the differential and output circuits;
   a controlling switch that varies the bias voltage of the bias voltage generating circuit to control the operation current;
   a switch provided at the output of the output circuit to block a signal from this output circuit; and
   a delay means for delaying the control timing of the blocking switch behind the control timing of the controlling switch;
   wherein, an output signal is obtained from the output of the blocking switch.

2. A differential amplifying apparatus comprising:
   a differential circuit for outputting a voltage corresponding to the difference between a voltage applied to a non-inverting input terminal and a voltage applied to an inverting input terminal;
   an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor;
   bias voltage generating circuits for generating a constant bias voltage signal that determines an operation current for the differential and output circuits;
   a controlling switch that varies the bias voltage of the bias voltage generating circuit to control the operation current;
   a first N-ch transistor and a capacitor connected in series between the bias voltage signal and a ground; and
   a second N-ch transistor connected in parallel between the capacitor and the ground;
   wherein, a control signal having the same polarity as that of a control signal controlling the controlling switch is supplied to the gate of the first N-ch transistor, while a control signal having a polarity opposite to that of the control signal controlling the controlling switch is supplied to the gate of the second N-ch transistor.

3. A differential amplifying apparatus comprising:
   a differential circuit for outputting a voltage corresponding to the difference between a voltage applied to a non-inverting input terminal and a voltage applied to an inverting input terminal;
   an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor;
   bias voltage generating circuits for generating a constant bias voltage signal that determines an operation current for the differential and output circuits;
   a controlling switch that varies the bias voltage of the bias voltage generating circuit to control the operation current;
   a first P-ch transistor and a capacitor connected in series between the bias voltage signal and a power supply terminal; and
   a second P-ch transistor connected between the capacitor and the power supply terminal;
   wherein, a control signal having a polarity opposite to that of the control signal controlling the controlling switch is supplied to the gate of the first P-ch transistor, while a control signal having the same polarity as that of the control switch is supplied to the gate of the second P-ch transistor.

4. A differential amplifying apparatus comprising:
   a CMOS-type differential circuit for outputting a voltage corresponding to the difference between a voltage applied to a non-inverting input terminal and a voltage applied to an inverting input terminal;
   an output circuit including a series circuit comprising a constant-current source transistor that allows a constant current to flow and a controlling transistor that controls a current depending on the output voltage from the differential circuit, said output circuit having an output terminal at a connection point between the constant-current source transistor and the controlling transistor;

a P-ch and an N-ch transistor bias voltage generating circuits for generating a constant bias voltage that determines an operation current for the CMOS-type differential and output circuits;

a controlling switch that varies the bias voltages of the P-ch and N-ch transistor bias voltage generating circuits to control the operation current;

a first N-ch transistor and a first capacitor connected in series between the P-ch transistor bias voltage signal and a ground;

a second N-ch transistor connected in parallel between the first capacitor and the ground;

a first P-ch transistor and a second capacitor connected in series between the N-ch transistor bias voltage signal and a power supply terminal; and a second P-ch transistor connected between the second capacitor and the power supply terminal;

wherein, a control signal having the same polarity as that of a control signal controlling the controlling switch is supplied to the gate of the first N-ch transistor, and a control signal having a polarity opposite to that of the control signal controlling said controlling switch is supplied to the gate of the second N-ch transistor; and wherein, a control signal having a polarity opposite to that of the control signal controlling the controlling switch is supplied to the gate of the first P-ch transistor, and a control signal having the same polarity as that of the control signal controlling said controlling switch is supplied to the gate of the second P-ch transistor.

5. A differential amplifying apparatus according to any one of claims 1 to 4, wherein the controlling switch for varying the bias voltage of the bias generating circuit to control the operation current is operated to control the current after an output signal from the output circuit has stabilized, the controlling switch being subsequently turned off to enable operations with operation timings required for normal operations.

6. A differential amplifying apparatus according to any one of claims 1 to 4, wherein the controlling switch for varying the bias voltage of the bias generating circuit to control the operation current is operated to stop or reduce the current before an output signal from the output circuit is generated, the controlling switch being subsequently turned off to enable operations with operation timings required for normal operations.

* * * * *